United States Patent
Tsutsumi et al.

(10) Patent No.: US 7,202,725 B2
(45) Date of Patent: Apr. 10, 2007

(54) DELAY CONTROL CIRCUIT DEVICE, AND A SEMICONDUCTOR INTEGRATED CIRCUIT DEVICE AND A DELAY CONTROL METHOD USING SAID DELAY CONTROL CIRCUIT DEVICE

(75) Inventors: Masanori Tsutsumi, Kyoto (JP); Junichi Yano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/339,322

(22) Filed: Jan. 10, 2003

(65) Prior Publication Data

US 2003/0141915 A1    Jul. 31, 2003

(30) Foreign Application Priority Data

Jan. 28, 2002    (JP)    ............ P 2002-018656

(51) Int. Cl.
*H03H 11/23*    (2006.01)
(52) U.S. Cl. ............... 327/261; 327/263; 327/233
(58) Field of Classification Search ........... 327/261, 327/263, 264, 233, 234, 170, 171, 172, 175, 327/176, 31, 35
See application file for complete search history.

(56) References Cited

U.S. PATENT DOCUMENTS

| | | | | |
|---|---|---|---|---|
| 5,436,573 A * | 7/1995 | Ogawa et al. | ............... | 326/17 |
| 5,497,263 A | 3/1996 | Masuda et al. | ............... | 327/278 |
| 5,717,345 A * | 2/1998 | Yokomizo et al. | ............ | 326/80 |
| 5,844,954 A | 12/1998 | Casasanta et al. | .......... | 375/373 |
| 5,959,480 A * | 9/1999 | Shoji | ............... | 327/161 |
| 6,037,249 A * | 3/2000 | Chiang et al. | ............... | 438/619 |
| 6,184,702 B1 * | 2/2001 | Takahashi et al. | ............ | 326/21 |
| 6,191,632 B1 | 2/2001 | Iwata et al. | ............... | 327/295 |
| 6,192,092 B1 | 2/2001 | Dizon et al. | ............... | 375/371 |
| 6,204,695 B1 * | 3/2001 | Alfke et al. | ............... | 326/93 |
| 6,285,208 B1 * | 9/2001 | Ohkubo | ............... | 326/15 |
| 6,300,573 B1 * | 10/2001 | Horie et al. | ............... | 174/113 R |
| 6,388,489 B1 * | 5/2002 | Fetzer et al. | ............... | 327/210 |
| 6,456,117 B2 * | 9/2002 | Tanaka | ............... | 326/101 |
| 6,456,137 B1 * | 9/2002 | Asao | ............... | 327/290 |
| 6,509,778 B2 * | 1/2003 | Braceras et al. | ............ | 327/308 |
| 2001/0054920 A1 | 12/2001 | Tsujino | ............... | 327/141 |

FOREIGN PATENT DOCUMENTS

JP    7-249685    9/1995
JP    10-112504    4/1998

* cited by examiner

*Primary Examiner*—Timothy P. Callahan
*Assistant Examiner*—An T. Luu
(74) *Attorney, Agent, or Firm*—McDermott Will & Emery LLP

(57) ABSTRACT

By forming adjacent wiring 4 adjacent to signal wiring 3 and using a control circuit 13 comprising a 2-input NAND 20 circuit or the like to input a signal S4 corresponding to a signal S3 in the signal wiring 3 to the adjacent wiring 4, it is made possible to change the delay of the signal S3 in the signal wiring 3 in several picoseconds, by using crosstalk with the signal S4 in the signal wiring 4. The inventive delay control circuit device can be provided by simply adding adjacent wiring 4 and a control circuit 13 to signal wiring 3. This implements a delay control circuit device for semiconductor integrated circuits that is capable of controlling a signal delay in several picoseconds without increasing the circuit scale.

11 Claims, 5 Drawing Sheets

DELAY CONTROL CIRCUIT DEVICE, AND A SEMICONDUCTOR INTEGRATED CIRCUIT DEVICE AND A DELAY CONTROL METHOD USING SAID DELAY CONTROL CIRCUIT DEVICE

BACKGROUND OF THE INVENTION

1. Field of the Invention

The present invention relates to a delay control circuit device, and a semiconductor integrated circuit device and a delay control method using the delay control circuit device.

2. Description of the Related Art

As semiconductor integrated circuits become faster, skew between clocks or between a clock and data has become a problem. Skew between clocks or between a clock and data could reduce the operating frequency or cause circuit malfunction due to data passing error or the like. It is thus necessary to reduce skew.

As a method for reducing skew, a method has been proposed for providing signal wiring with a delay control circuit to change the delay time in a programmable way (U.S. Pat. No. 6,192,092). In this technology, a plurality of drive circuits with various sizes of transistors are provided and the size of transistor to drive signal wiring can be selected by selecting which drive circuit will drive the signal wiring, thereby controlling the delay of the signal wiring in several tens of picoseconds.

As mentioned hereabove, skew between clocks or between a clock and data could reduce the operating frequency or cause circuit malfunction due to data passing error or the like, so that it is necessary to provide signal wiring with a delay control circuit to change the delay time in a programmable way, in order to reduce skew. Introduction of speeding up of semiconductor integrated circuits will be accompanied by a problem of skew in several picoseconds.

In the configuration of a related art delay control circuit, it is possible to change the delay time in several hundreds to several tens of picoseconds, but it is extremely difficult to change the delay time in units of very small time order of several picoseconds. Such an attempt will require a drive circuit having a very large number of transistors of various sizes thus considerably increasing the circuit scale.

SUMMARY OF THE INVENTION

The present invention has been proposed to eliminate the problems of such related art technology and aims are providing a delay control circuit device and a delay control method for semiconductor integrated circuits that are capable of controlling a signal delay in several picoseconds without increasing the circuit scale.

In order to solve the problems, the invention comprises signal wiring, adjacent wiring formed adjacent to the signal wiring, and a control circuit for controlling a signal in the adjacent wiring and the control circuit outputs a signal corresponding to a signal in the signal wiring. In this way, by providing adjacent wiring that is adjacent to signal wiring and controlling a signal of the adjacent wiring, it is possible to change the delay time of a signal in signal wiring in several picoseconds by utilizing crosstalk with the adjacent wiring. Thus, this provides a delay control circuit device for semiconductor integrated circuits that is capable of controlling a signal delay in several picoseconds without increasing the circuit scale.

In a delay control circuit device according to the invention, the control circuit may output a signal of opposite phase to a signal in the signal wiring. By inputting a signal of opposite phase to the signal in the signal wiring to the adjacent wiring, it is possible to increase a delay of the signal in the signal wiring.

In a delay control circuit device according to the invention, the control circuit may output a signal in phase with a signal in the signal wiring. By inputting a signal in phase with the signal in the signal wiring to the adjacent wiring, it is possible to decrease a delay of the signal in the signal wiring.

In a delay control circuit device according to the invention, the control circuit may output a signal in phase with/of opposite phase to a signal in the signal wiring. By inputting a signal in phase with/of opposite phase to the signal in the signal wiring to the adjacent wiring, it is possible to decrease or increase a delay of the signal in the signal wiring.

In a delay control circuit device according to the invention, the control circuit preferably outputs different signals on the rising edge and falling edge of a signal in the signal wiring. By separately controlling an input signal to the adjacent wiring on the rising edge and falling edge of the signal in the signal wiring, it is possible to separately change the rise time and fall time of the signal in the signal wiring, thereby changing the duty ratio of the signal in the signal wiring.

In a delay control circuit device according to the invention, the control circuit may output a signal corresponding to a signal in the signal wiring only on the rising edge of the signal in the signal wiring. By inputting a signal of opposite phase to the signal in the signal wiring to the adjacent wiring only on the rising edge of the signal in the signal wiring, it is possible to decrease the HIGH duration of the signal in the signal wiring. By inputting a signal in phase with the signal in the signal wiring to the adjacent wiring, it is possible to increase the HIGH duration of the signal in the signal wiring.

In a delay control circuit device according to the invention, the control circuit may output a signal corresponding to a signal in the signal wiring only on the falling edge of the signal in the signal wiring. By inputting a signal of opposite phase to the signal in the signal wiring to the adjacent wiring only on the falling edge of the signal in the signal wiring, it is possible to increase the HIGH duration of the signal in the signal wiring. By inputting a signal in phase with the signal in the signal wiring to the adjacent wiring, it is possible to decrease the HIGH duration of the signal in the signal wiring.

In a delay control circuit device according to the invention, the control circuit may output a signal corresponding to a signal in the signal wiring only on the rising edge and falling edge of the signal in the signal wiring. By inputting a signal corresponding to a signal in the signal wiring to the adjacent wiring only on the rising edge and falling edge of the signal in the signal wiring, it is possible to decrease or increase the HIGH duration of the signal in the signal wiring.

In a delay control circuit device according to the invention, the adjacent wiring may comprise a plurality of wiring sections and the control circuit may input a signal corresponding to a signal in the signal wiring or a fixed signal (for example a signal of 0V in voltage) per wiring section of the adjacent wiring. By configuring the adjacent wiring with a plurality of wiring sections, it is possible to change the space between the signal wiring and the adjacent wiring on a per wiring section basis. Expanding the wiring space in stages allows high-accuracy control of the influence of crosstalk on the signal in the signal wiring. As a result, it is possible to accurately change a delay of the signal in the signal wiring in units of extremely small time. By changing an input signal or using a fixed input signal on a per wiring section basis, it is possible to change the delay of the signal in the signal wiring in a programmable way.

In a delay control circuit device according to the invention, the adjacent wiring may comprise a plurality of wiring sections, a space between each of the wiring sections and the signal wiring being identical with each other. By changing the length of the wiring section, it is possible to change the influence of crosstalk by a signal in the wiring section on the signal in the signal wiring.

In a delay control circuit device according to the invention, the adjacent wiring may comprise a plurality of wiring sections, a space between each of the wiring sections and the signal wiring being different from each other. By changing the space between the signal wiring and each wiring section, the influence of crosstalk by the signal in each wiring section on the signal in the signal wiring is changed. Thus it is possible to change in stages the delay caused by crosstalk.

In order to solve the problems, a delay control method according to the invention provides adjacent wiring that is adjacent to signal wiring and inputs a signal corresponding to a signal in the signal wiring to the adjacent wiring. In this way, by providing adjacent wiring that is adjacent to signal wiring and controlling a signal in the adjacent wiring, it is possible to change the delay time of a signal in the signal wiring by using crosstalk with the adjacent wiring in several picoseconds. Thus it is possible to provide a delay control method for semiconductor integrated circuits that is capable of controlling a signal delay in several picoseconds without increasing the circuit scale.

In a delay control method according to the invention, a signal of opposite phase to a signal in the signal wiring may be input to the adjacent wiring. By inputting a signal of opposite phase to the signal in the signal wiring to the adjacent wiring, it is possible to increase a delay of the signal in the signal wiring.

In a delay control method according to the invention, a signal in phase with a signal in the signal wiring may be input to the adjacent wiring. By inputting a signal in phase with the signal in the signal wiring to the adjacent wiring, it is possible to decrease a delay of the signal in the signal wiring.

In a delay control method according to the invention, a signal in phase with/of opposite phase to a signal in the signal wiring may be input to the adjacent wiring. By inputting a signal in phase with/of opposite phase to the signal in the signal wiring to the adjacent wiring, it is possible to decrease or increase a delay of the signal in the signal wiring.

In a delay control method according to the invention, different signals corresponding to a signal in the signal wiring maybe input to the adjacent wiring on the rising edge and falling edge of a signal in the signal wiring. By separately controlling an input signal to the adjacent wiring on the rising edge and falling edge of the signal in the signal wiring, it is possible to separately change the rise time and fall time of the signal in the signal wiring, thereby changing the duty ratio of the signal in the signal wiring.

In a delay control method according to the invention, a signal corresponding to a signal in the signal wiring may be input to the adjacent wiring only on the rising edge of a signal in the signal wiring. By inputting a signal of opposite phase to the signal in the signal wiring to the adjacent wiring only on the rising edge of the signal in the signal wiring, it is possible to decrease the HIGH duration of the signal in the signal wiring. By inputting a signal in phase with the signal in the signal wiring to the adjacent wiring, it is possible to increase the HIGH duration of the signal in the signal wiring.

In a delay control method according to the invention, a signal corresponding to a signal in the signal wiring may be input only on the falling edge of the signal in the signal wiring. By inputting a signal of opposite phase to the signal in the signal wiring to the adjacent wiring only on the falling edge of the signal in the signal wiring, it is possible to increase the HIGH duration of the signal in the signal wiring. By inputting a signal in phase with the signal in the signal wiring to the adjacent wiring, it is possible to decrease the HIGH duration of the signal in the signal wiring.

In a delay control method according to the invention, a signal corresponding to a signal in the signal wiring may be input only on the rising edge and falling edge of the signal in the signal wiring. By inputting a signal of opposite phase to the signal in the signal wiring to the adjacent wiring only on the rising edge and falling edge of the signal in the signal wiring, it is possible to decrease or increase the HIGH duration of the signal in the signal wiring.

In a delay control method according to the invention, the adjacent wiring may comprise a plurality of wiring sections and a signal corresponding to a signal in the signal wiring or a fixed signal (for example a signal of 0V in voltage) may be input per wiring section of the adjacent wiring. By configuring the adjacent wiring with a plurality of wiring sections, it is possible to change the space between the signal wiring and the adjacent wiring on a per wiring section basis. Enhancing the wiring space in stages allows high-accuracy control of the influence of crosstalk on the signal in the signal wiring. As a result, it is possible to accurately change a delay of the signal in the signal wiring in units of extremely small time. By changing an input signal or using a fixed input signal on a per wiring section basis, it is possible to change the delay of the signal in the signal wiring in a programmable way.

In a delay control method according to the invention, the adjacent wiring may comprise a plurality of wiring sections, a space between each of the wiring sections and the signal wiring being identical with each other. By changing the length of the wiring section, it is possible to change the influence of crosstalk by the signal in the wiring section on the signal in the signal wiring.

In a delay control method according to the invention, the adjacent wiring may comprise a plurality of wiring sections, a space between each of the wiring sections and the signal wiring being different from each other. By changing the space between the signal wiring and each wiring section, the influence of crosstalk by a signal in each wiring section on a signal in the signal wiring is changed. Thus it is possible to change a variation of the delay caused by crosstalk.

A semiconductor integrated circuit device according to the invention is characterized in that the device comprises a delay control circuit including a semiconductor integrated circuit including signal wiring, adjacent wiring formed adjacent to at least part of the signal wiring, and a control circuit for controlling a signal in the adjacent wiring so as to output a signal corresponding to a signal in the signal wiring.

The delay control circuit is generally formed on a same substrate, on the same wiring layer as the signal wiring or on the upper or lower layer thereof via a layer insulation film.

BRIEF DESCRIPTION OF THE DRAWINGS

FIG. 2(a) is a circuit diagram and FIG. 2(b) is a signal transition diagram;

FIG. 3(a) is a circuit diagram and FIG. 3(b) is a signal transition diagram;

FIG. 4(a) is a circuit diagram and FIG. 4(b) is a signal transition diagram;

DESCRIPTIONS OF THE PREFERRED EMBODIMENTS

Embodiments of the invention will be described based on the drawings.

Figure 1:
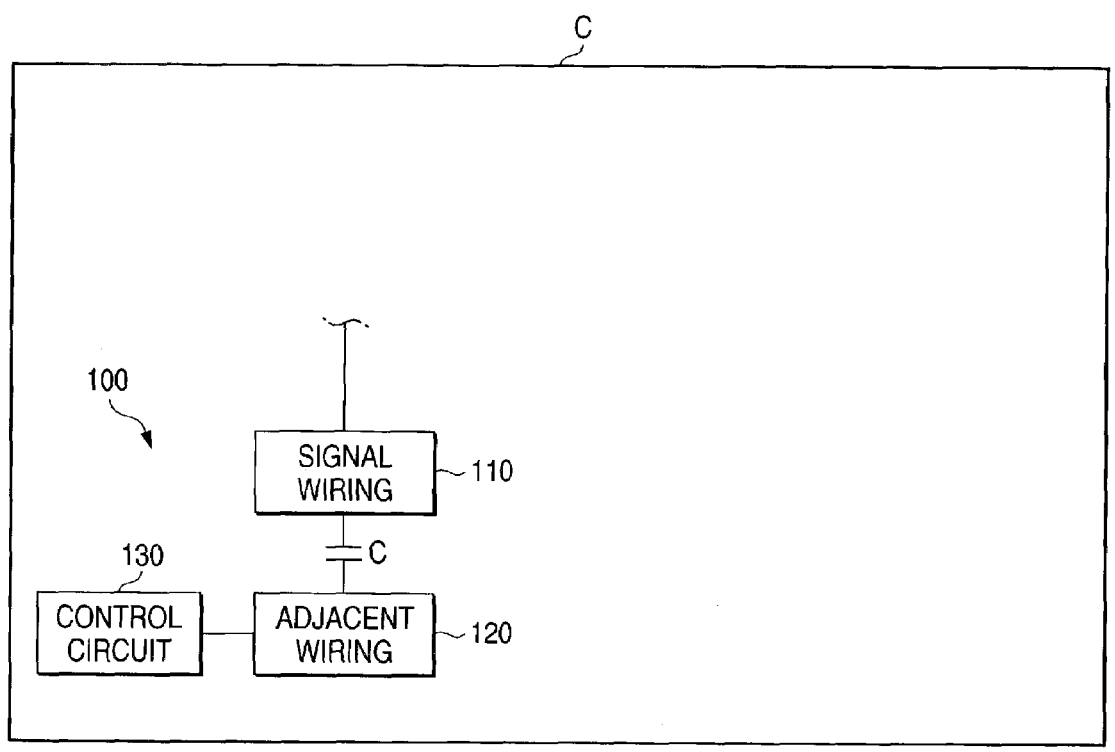
FIG. 1 is an explanatory drawing of the principle of a delay control circuit device and a delay control method according to the invention.

FIG. 1 is an explanatory drawing of the principle of a delay control circuit device and a delay control method according to the invention. As shown in the figure, a delay control circuit device 100 according to the invention comprises signal wiring 110, adjacent wiring 120 that is adjacent to the signal wiring 110, and a control circuit 130 for controlling a signal in the adjacent wiring 120. Between the signal wiring 110 and the adjacent wiring 120 exists parasitic capacitance C. A delay of a signal in the signal wiring 110 varies with the crosstalk effect due to a signal transition in a signal in the adjacent wiring 120.

The adjacent wiring 120 comprises a wiring pattern formed on the same conductor layer as the signal wiring 110 or on the upper or lower layer thereof via a layer insulation film. The wiring pattern is formed in a dedicated area provided for controlling the signal in the signal wiring 110.

The delay control circuit device is mounted in close proximity of the signal wiring of a semiconductor integrated circuit to form the semiconductor integrated circuit.

Figure 2:
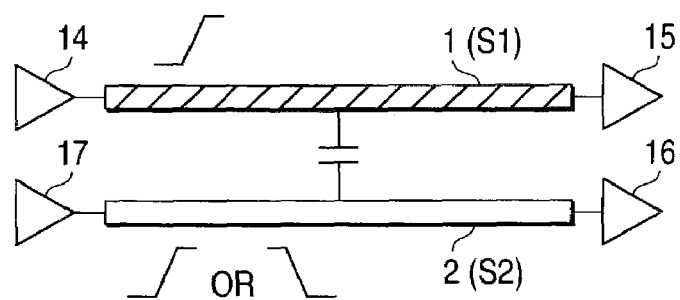
FIG. 2 is an explanatory drawing of the crosstalk effect between signal wiring and adjacent wiring in a delay control circuit device according to the invention.
Figure 2:
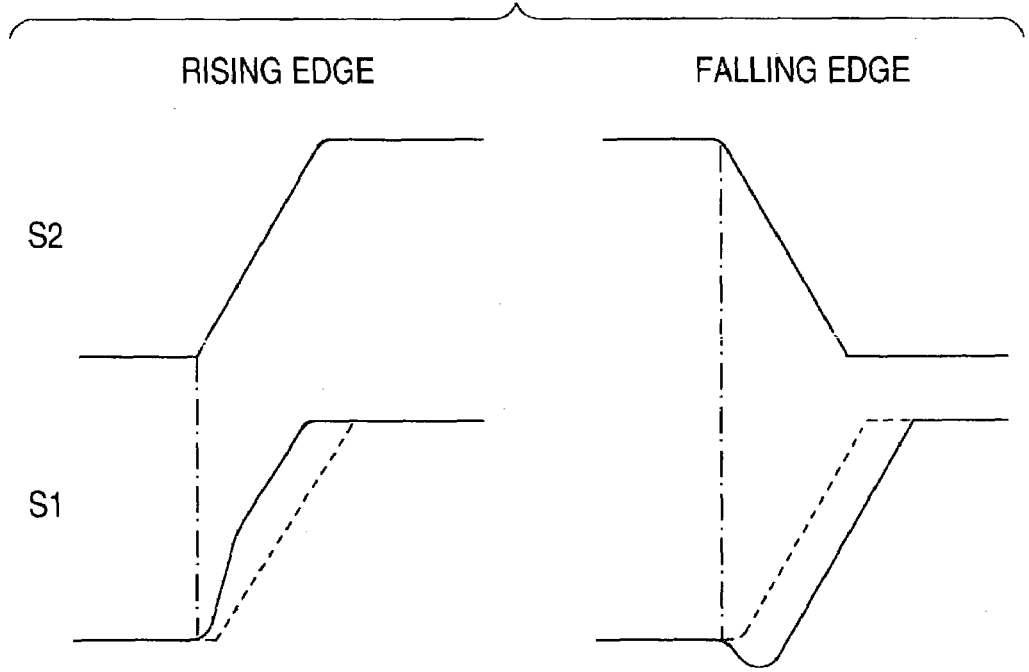

FIG. 2 is an explanatory drawing of the crosstalk effect between signal wiring and adjacent wiring in a delay control circuit device according to the invention.

In the circuit diagram of FIG. 2(a), numerals 14, 15, 16, 17 represent buffers. The buffer 14 is connected to the buffer 15 via signal wiring 1. The buffer 16 is connected to the buffer 17 via adjacent wiring 2. The signal wiring 1 and the adjacent wiring 2 are arranged in parallel with each other. Between the wiring 1 and wiring 2 exists parasitic capacitance C.

FIG. 2(b) is a signal transition diagram. In case a signal S2 in the adjacent wiring 2 does not vary when a signal S1 in the signal wiring varies, the signal S1 in the signal wiring 1 appears in a waveform represented by dotted lines. When the signal S2 in the adjacent wiring rises on the rising edge of the signal S1 in the signal wiring 1, the delay of the signal S1 in the signal wiring 1 is decreased due to crosstalk effects. When the signal S2 in the adjacent wiring falls on the rising edge of the signal S1 in the signal wiring 1, the delay of the signal S1 in the signal wiring 1 is increased due to crosstalk effects.

Figure 3:
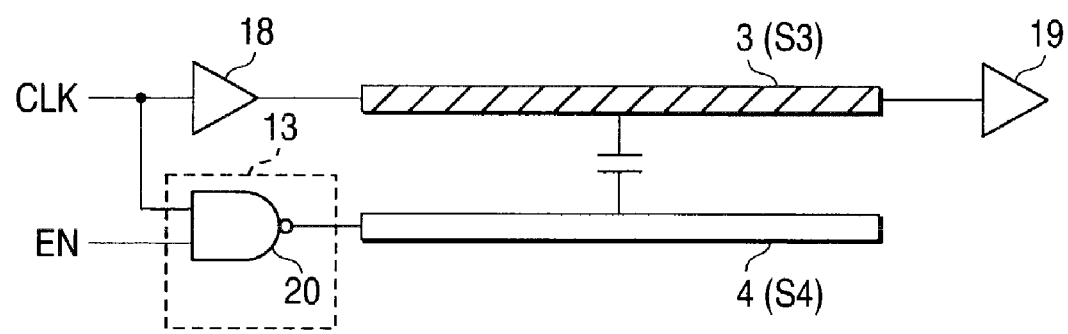
FIG. 3 shows the first embodiment of a delay control circuit device according to the invention.
Figure 3:
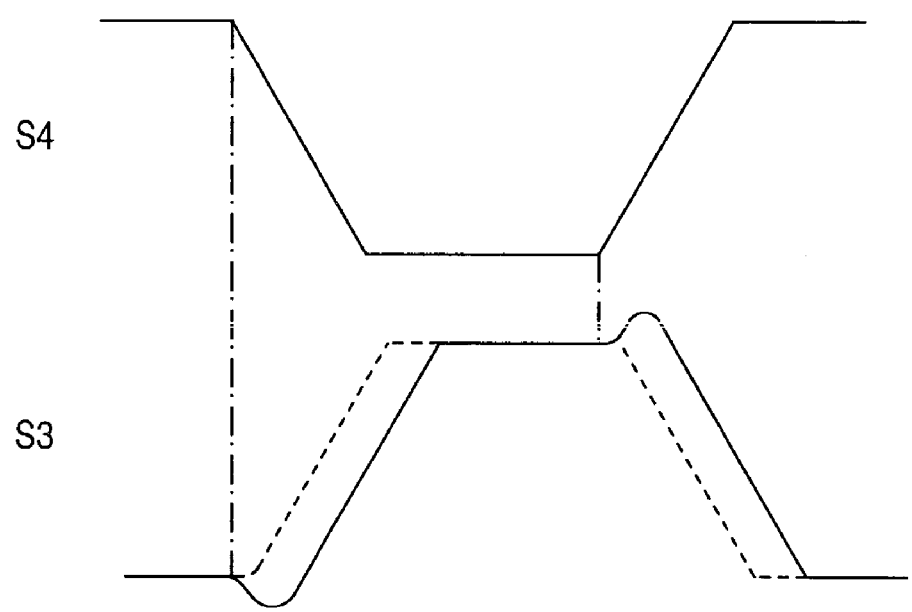

FIG. 3 shows the first embodiment of a delay control circuit device according to the invention.

In the circuit diagram of FIG. 3(a), a numeral 13 represents a control circuit and numerals 18, 19 represent buffers. The buffer 18 uses an input signal CLK as an input and is connected to the buffer 19 via signal wiring 3. The control circuit 13 uses an input signal CLK and a control signal EN as inputs and is connected to adjacent wiring 4. The control circuit 13 comprises a 2-input NAND circuit 20. In case the control signal EN is HIGH, a signal S4 in the adjacent wiring 4 is of opposite phase to a signal S3 in the signal wiring 3.

FIG. 3(b) is a signal transition diagram. In case the control signal EN is HIGH, the signal S4 in the adjacent wiring 4 is of opposite phase to the signal S3 in the signal wiring 3. The signal S3 in the signal wiring 3 shows a larger signal delay due to crosstalk effects with the signal S4 in the adjacent wiring 4. In case the control signal EN is LOW, the signal S4 in the adjacent wiring 4 is fixed to HIGH, so that the delay of the signal S3 in the signal wiring 3 does not vary and appears in a waveform represented by dotted lines. Thus, it is possible to increase the delay of the signal S3 in the signal wiring 3 by controlling the control signal EN.

According to the configuration in FIG. 3, it is possible to provide a delay control circuit by simply adding a control circuit 13 comprising the adjacent wiring 4 and a 2-input NAND circuit 20 to the signal wiring 3. Thus it is possible to provide a delay control circuit device for semiconductor integrated circuits that is capable of controlling a signal delay in several picoseconds without increasing the circuit scale.

While the foregoing example relates to a method for increasing the delay of the signal S3 in the signal wiring 3 by making the phase of the signal S4 in the adjacent wiring 4 opposite to that of the signal S3 in the signal wiring 3, it is possible to turn the signal S4 in the adjacent wiring 4 in phase with the signal S3 in the signal wiring 3 by replacing a 2-input NAND circuit with a 2-input AND circuit as the control circuit 13, thereby to decrease the delay of the signal S3 in the signal wiring 3.

By providing the control circuit 13 comprising a circuit for outputting a signal in phase with/of opposite phase to the signal S3 in the signal wiring 3, it is possible to increase or decrease the signal S3 of the signal wiring 3.

Figure 4:
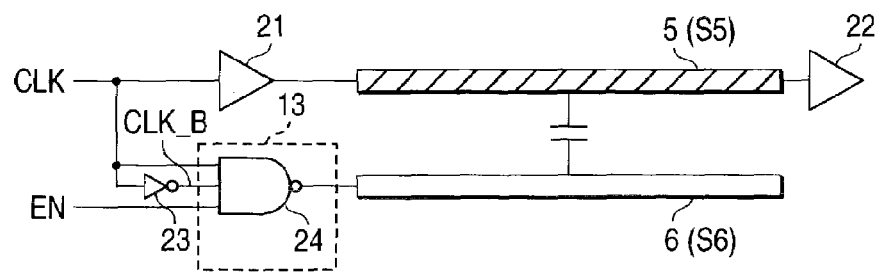
FIG. 4 shows the second embodiment of a delay control circuit device according to the invention.
Figure 4:
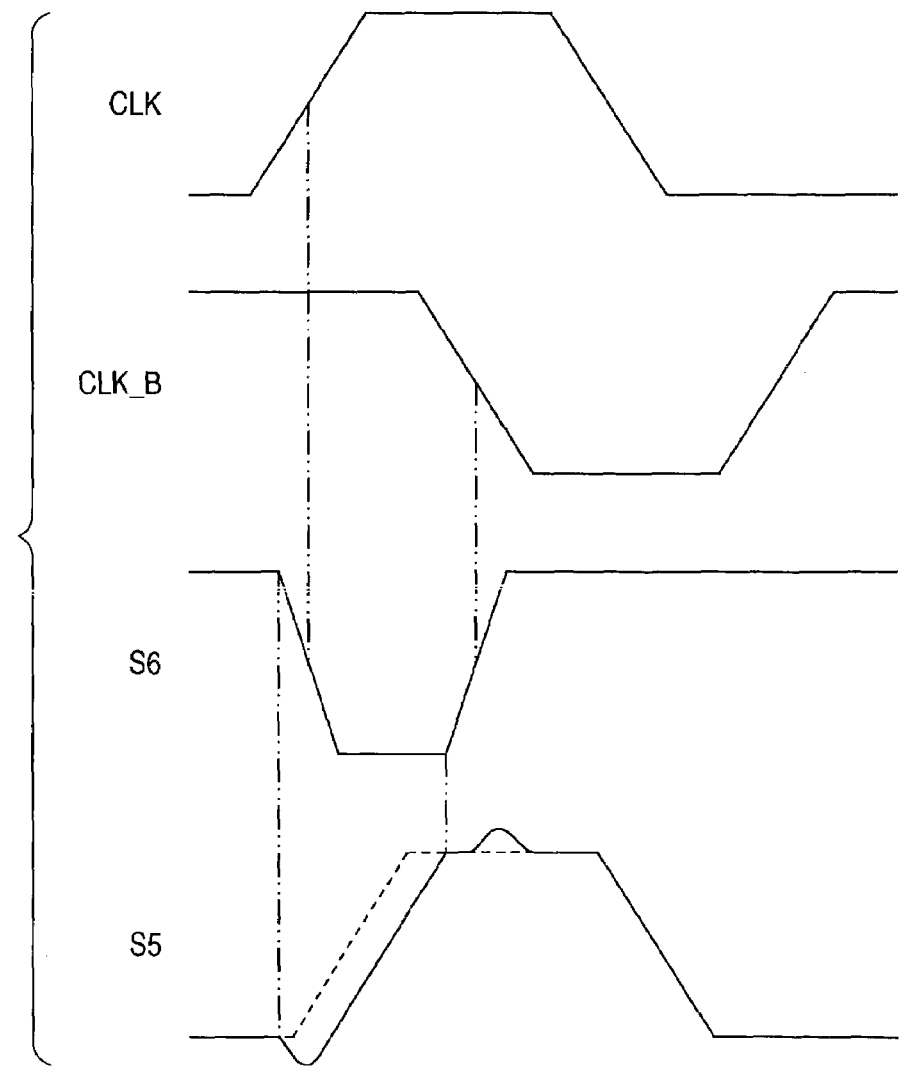

FIG. 4 shows the second embodiment of a delay control circuit device according to the invention.

In the circuit diagram of FIG. 4(a), numerals 21, 22 represent buffers. The buffer 21 uses an input signal CLK as an input and is connected to the buffer 22 via signal wiring 5.

The control circuit 13 uses an input signal CLK, a reverse signal CLK_B obtained by reversing the input signal CLK by using an inverter 23 and a control signal EN as an input and is connected to adjacent wiring 6. The control circuit 13 comprises a 3-input NAND circuit 24. In case the control signal EN is HIGH, a signal S6 in the adjacent wiring 6 appears as a pulse that falls on the rising edge of the input signal CLK and rises on the falling edge of the reverse signal CLK_B.

FIG. 4(b) is a signal transition diagram. In case the control signal EN is HIGH, the signal S6 in the adjacent wiring 6 falls on the rising edge of the signal S5 in the signal wiring 5 thus increasing the delay of the signal S5 in the signal wiring 5 due to crosstalk effects. The signal S6 in the adjacent wiring 6 does not vary on the falling edge of the signal S5 in the signal wiring 5. Thus the delay of the signal S5 in the signal wiring 5 does not vary and appears in a waveform represented by solid lines. As a result, the signal delay increases only on the rising edge of the signal wiring 5 thus decreasing the HIGH duration of the signal S5 in the signal wiring 5. The duty ratio of the signal S5 in the signal wiring 5 is represented by a value obtained by dividing the HIGH duration of the signal S5 by the LOW duration of the signal S5. Therefore, by decreasing the HIGH duration of the signal S5 and increasing the LOW duration of the same signal S5, it is possible to change the duty ratio of the signal S5 in the signal wiring 5.

In case the signal S6 in the adjacent wiring 6 rises on the rising edge of the signal S5 in the signal wiring 5, the signal S5 in the signal wiring 5 is influenced by the crosstalk on the rising edge of the signal S6 in the adjacent wiring 6 thus changing the delay value of the signal S5 in the signal wiring 5. By increasing the transition time of the inverter 23 so that the signal S6 in the adjacent wiring 6 will rise after the signal S5 in the signal wiring 5 has fully risen, it is possible to eliminate the influence of crosstalk on the rising edge of the signal S6 in the adjacent wiring 6.

In case the control signal EN is LOW, the signal S6 in the signal wiring 6 is fixed to HIGH so that the signal wiring 5 is not influenced by the crosstalk of signal wiring S6. Thus the signal delay does not vary and the signal is represented in a waveform by dotted lines. Thus it is possible to decrease the HIGH duration of the signal S5 of the signal wiring 5 by controlling the control signal EN.

According to the configuration in FIG. 4, it is possible to provide a delay control circuit by simply adding adjacent wiring 6, a control circuit 13 comprising a 3-input NAND circuit 24, and an inverter to the signal wiring 5. Thus it is possible to provide a delay control circuit device for semiconductor integrated circuits that is capable of controlling a signal delay in several picoseconds without increasing the circuit scale.

While a method for increasing the signal delay only on the rising edge of the signal S5 of the signal wiring 5 to decrease the HIGH duration of the signal S5 of the signal wiring 5 by providing the signal S6 in the adjacent wiring 6 as a signal pulse that falls on the rising edge of the signal S5 of the signal wiring 5, is described in FIG. 4, it is possible to provide the signal S6 in the adjacent wiring 6 as a signal pulse that rises on the rising edge of the signal S5 of the signal wiring by replacing a 3-input NAND circuit with a 3-input AND circuit as the control circuit 13, thereby decreasing the signal delay only on the rising edge of the signal S5 in the signal wiring 5, thus increasing the HIGH duration of the signal S5 of the signal wiring 5.

While the HIGH duration of the signal S5 of the signal wiring 5 is changed by varying the signal delay only on the rising edge of the signal S5 of the signal wiring 5 by outputting a signal pulse from the control circuit 13 in FIG. 4, it is also possible to change the LOW duration of the signal S5 of the signal wiring 5 by varying the signal delay only on the falling edge of the signal S5 of the signal wiring 5 by outputting a signal pulse from the control circuit 13.

By providing the control circuit 13 comprising a circuit for outputting a signal pulse on the rising edge and falling edge of the signal S5 in the signal wiring 5, it is possible to separately increase or decrease the signal delay on the rising edge and falling edge of the signal S5 in the signal wiring 5.

Figure 5:
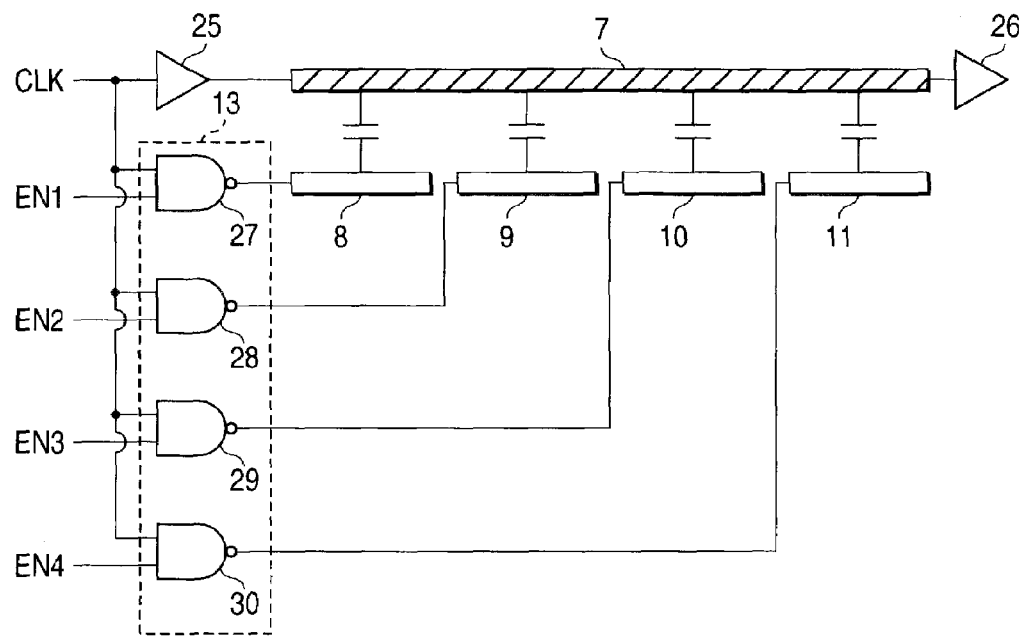
FIG. 5 is a circuit diagram showing the third embodiment of a delay control circuit device according to the invention.

FIG. 5 shows the third embodiment of a delay control circuit device according to the invention.

In this circuit diagram numerals 25, 26 represent buffers. The buffer 25 uses an input signal CLK as an input and is connected to the buffer 26 via signal wiring 7. The control circuit 13 uses an input signal CLK and control signals EN1, EN2, EN3, EN4 as an input and is connected to a plurality of (four in this example) wiring sections 8, 9, 10, 11 that composes adjacent wiring. Spaces between the wiring sections 8, 9, 10, 11 and the signal wiring 7 are set to a same value.

The control circuit 13 comprises 2-input NAND circuits 27, 28, 29, 30. In case the control signals EN1, EN2, EN3, EN4 are HIGH, signals in the wiring sections 8, 9, 10, 11 are respectively of opposite phase to the signal in the signal wiring 7. In case the control signals EN1, EN2, EN3, EN4 are LOW, signals in the wiring sections 8, 9, 10, 11 are respectively fixed to HIGH. The influence of crosstalk on the signal wiring 7 by the signals in the wiring sections 8, 9, 10, 11 may be changed by changing the lengths of the wiring sections 8, 9, 10, 11.

According to the circuit configuration in FIG. 5, all the signals in the wiring sections 8, 9, 10, 11 can be varied in total five stages, from a state where all these signals are fixed to HIGH to a state where all these signals are of opposite phase to the signal in the signal wiring 7. This makes it possible to change the delay of the signal in the signal wiring 7 in five stages.

In this way, according to the configuration in FIG. 5, it is possible to provide a delay control circuit by simply adding an adjacent wiring comprising wiring sections 8, 9, 10, 11 and a control circuit 13 comprising 2-input NAND circuits 27, 28, 29, 30 to the signal wiring 7. Thus it is possible to provide a delay control circuit device for semiconductor integrated circuits that is capable of controlling a signal delay in several picoseconds without increasing the circuit scale.

While the length of each wiring section 8, 9, 10, 11 is equal to each other in FIG. 5, it is possible to change the lengths of these wiring sections at the ratio of 1:2:4:8 and provide the wiring sections 8, 9, 10, 11 with control signals EN1, EN2, EN3, EN4 thus change the delay of the signal in the signal wiring 7 in 16 stages.

Figure 6:
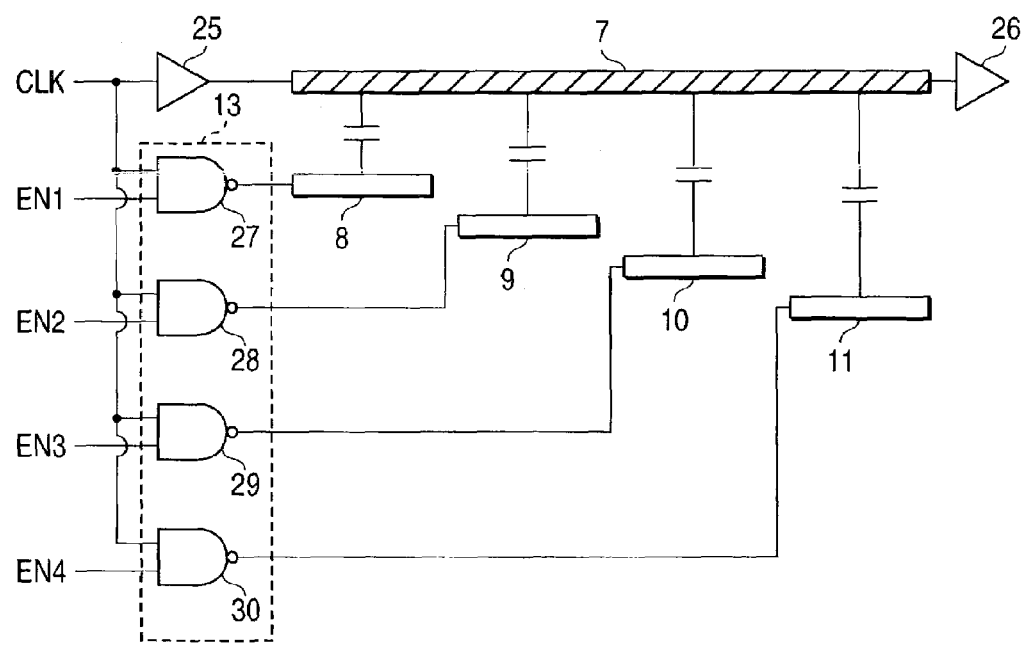
FIG. 6 is a circuit diagram showing the fourth embodiment of a delay control circuit device according to the invention.

Instead of providing lengths of the wiring sections 8, 9, 10, 11 different from each other, it is possible to provide spaces between the signal wiring 7 and the wiring sections 13, 14, 15, 16 different from each other, as in the fourth embodiment in FIG. 6. Different spaces between the signal wiring 7 and the wiring sections 13, 14, 15, 16 changes the influence of crosstalk by the signals in the wiring sections 13, 14, 15, 16 on the signal in the signal wiring 7. Thus it is possible to change the delay caused by crosstalk in five stages.

The influence of crosstalk by the signals in the wiring sections 13, 14, 15, 16 on the signal in the signal wiring 7 becomes larger as the spaces between the signal wiring 7 and the wiring sections 13, 14, 15, 16 become smaller. The influence becomes smaller as the spaces between the signal wiring 7 and the wiring sections 13, 14, 15, 16 become larger. Thus, by controlling the signal of a wiring section whose space to the signal wiring 7 is larger, it is possible to accurately control the influence of crosstalk on the signal of the signal wiring 7.

Even in case the wiring length or wiring space varies due to process variations or the like, it is possible to provide extremely small crosstalk at a high accuracy by allowing a large space between signal wiring and adjacent wiring. Thus it is accurately possible to change the delay of a signal in signal wiring in units of very small time order.

According to the aforementioned embodiments, it is possible to reduce skew in a signal between clocks or between a clock and data thereby increasing the operating frequency of a semiconductor integrated circuit as well as stabilize the circuit operation.

It is also possible to configure a control circuit of a delay control circuit device with a simple circuit such as a NAND circuit or the like and implement a delay control circuit device through addition of adjacent wiring and a control circuit alone. This reduces the influence of a circuit area caused by provision of a delay control circuit.

As mentioned earlier, according to the invention, by providing adjacent wiring that is adjacent to signal wiring and controlling the signal of the adjacent wiring, it is possible to change a signal delay in several picoseconds without increasing the circuit scale.

By changing a signal in adjacent wiring on the rising edge and falling edge of a signal in adjacent wiring, it is possible to change the HIGH duration and LOW duration of a signal in signal wiring in picoseconds. This allows high-accuracy change of the duty ratio of a signal in adjacent wiring.

By configuring adjacent wiring with a plurality of wiring sections and controlling an input signal on a per wiring section basis, it is possible to change the delay of a signal in signal wiring in picoseconds in a programmable way.

What is claimed is:

1. A delay control circuit device for semiconductors, characterized in that said device comprises:
   a signal wiring,
   an adjacent wiring which comprises a plurality of wiring sections, the plurality of wiring sections formed adjacent to said signal wiring, and
   a control circuit for outputting a plurality of signals, each of the signals corresponding to either a signal in said signal wiring or a fixed signal and being input to the corresponding wiring sections, and the condition of each of the signals is determined based on a plurality of control signals, which are input to the control circuit.

2. A delay control circuit device according to claim 1, characterized in that said adjacent wiring comprises a plurality of wiring sections, a space between each of said wiring sections and said signal wiring being identical with each other.

3. A delay control circuit device according to claim 1, characterized in that said adjacent wiring comprises a plurality of wiring sections, a space between each of said wiring sections and said signal wiring being different from each other.

4. A delay control circuit device according to claim 1, wherein the control circuit includes a NAND circuit.

5. A delay control circuit device according to claim 1, wherein said signal wiring and adjacent wiring are formed on a same substrate.

6. A delay control circuit device according to claim 5, wherein said signal wiring and adjacent wiring are formed on a same wiring layer.

7. A delay control method for semiconductor integrated circuits comprising the steps of:
   providing a signal wiring,
   providing an adjacent wiring which comprises a plurality of wiring sections, the plurality of wiring sections formed adjacent to said signal wiring, and
   providing a control circuit for outputting a plurality of signals, each of the signals corresponding to either a signal in said signal wiring or a fixed signal and being input to the corresponding wiring sections, and the condition of each of the signals is determined based on a plurality of control signals which are input to the control circuit.

8. A delay control method according to claim 7, characterized in that said adjacent wiring comprises a plurality of wiring sections, a space between each of said wiring sections and said signal wiring being identical with each other.

9. A delay control method according to claim 7, characterized in that said adjacent wiring comprises a plurality of wiring sections, a space between each of said wiring sections and said signal wiring being different from each other.

10. A delay control method according to claim 7, wherein said signal wiring and adjacent wiring are formed on a same substrate.

11. A delay control method according to claim 10, wherein said signal wiring and adjacent wiring are formed on a same wiring layer.

* * * * *